US007733696B2

(12) United States Patent
Lee et al.

(10) Patent No.: US 7,733,696 B2
(45) Date of Patent: Jun. 8, 2010

(54) NON-VOLATILE MEMORY DEVICES INCLUDING LOCAL CONTROL GATES ON MULTIPLE ISOLATED WELL REGIONS AND RELATED METHODS AND SYSTEMS

(75) Inventors: Yong-Kyu Lee, Kyungki-Do (KR);
Myung-Jo Chun, Kyungki-Do (KR);
Young-Ho Kim, Kyungki-Do (KR);
Hee-Seog Jeon, Kyung-Ki Do (KR);
Jeong-Uk Han, Kyung-Ki Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 89 days.

(21) Appl. No.: 11/818,238

(22) Filed: Jun. 13, 2007

(65) Prior Publication Data

US 2008/0080244 A1    Apr. 3, 2008

(30) Foreign Application Priority Data

Sep. 29, 2006   (KR) ...................... 10-2006-0095901

(51) Int. Cl.
*G11C 11/34* (2006.01)
(52) U.S. Cl. .......................... 365/185.05; 365/185.11; 365/185.13; 365/185.17; 365/185.18; 365/185.27; 365/185.29; 365/185.33
(58) Field of Classification Search ............ 365/185.05, 365/185.11, 185.13, 185.14, 185.18, 185.26, 365/185.27, 185.28, 185.29, 185.33, 185.17
See application file for complete search history.

(56) References Cited

U.S. PATENT DOCUMENTS 6,031,764 A    2/2000  Imamiya et al.

6,243,292 B1    6/2001  Kobayashi et al.

(Continued)

FOREIGN PATENT DOCUMENTS

JP         06-060679 A        3/1994

(Continued)

OTHER PUBLICATIONS

Notice of Allowance for Korean Application No. 10-2006-0095901; Aug. 21, 2007.

(Continued)

*Primary Examiner*—Trong Phan
(74) *Attorney, Agent, or Firm*—Myers Bigel Sibley & Sajovec, P.A.

(57) ABSTRACT

A non-volatile integrated circuit memory device may include a semiconductor substrate having first and second electrically isolated wells of a same conductivity type. A first plurality of non-volatile memory cell transistors may be provided on the first well, and a second plurality of non-volatile memory cell transistors may be provided on the second well. A local control gate line may be electrically coupled with the first and second pluralities of non-volatile memory cell transistors, and a group selection transistor may be electrically coupled between the local control gate line and a global control gate line. More particularly, the group selection transistor may be configured to electrically couple and decouple the local control gate line and the global control gate line responsive to a group selection gate signal applied to a gate of the group selection transistor. Related methods and systems are also discussed.

10 Claims, 9 Drawing Sheets

U.S. PATENT DOCUMENTS

| | | | |
|---|---|---|---|
| 6,262,914 B1 * | 7/2001 | Smayling et al. | 365/185.11 |
| 6,307,781 B1 | 10/2001 | Shum | |
| 6,914,815 B2 * | 7/2005 | Kamei et al. | 365/185.11 |
| 7,006,381 B2 * | 2/2006 | Dormans et al. | 365/185.28 |
| 7,031,198 B2 * | 4/2006 | Kanai | 365/185.11 |
| 7,050,332 B2 * | 5/2006 | Kamei et al. | 365/185.28 |
| 7,075,823 B2 * | 7/2006 | Harari | 365/185.11 |
| 2004/0240273 A1 | 12/2004 | Sakui | |
| 2005/0052918 A1 | 3/2005 | Dormans et al. | |

FOREIGN PATENT DOCUMENTS

| | | |
|---|---|---|
| JP | 06-318684 A | 11/1994 |
| JP | 11-177071 | 7/1999 |
| JP | 2000-021183 | 1/2000 |
| JP | 2001-210808 A | 8/2001 |
| JP | 2003-031704 | 1/2003 |
| JP | 2004-326864 A | 11/2004 |
| KR | 100165468 B1 | 9/1998 |
| KR | 1020010008438 A | 2/2001 |

OTHER PUBLICATIONS

English translation of Notice of Allowance for Korean Application No. 10-2006-0095901; Aug. 21, 2007.

G. Tao et al; "Device architecture and reliability aspects of a novel 1.22 μm node for embedded applications"; Microelectronic Engineering 72 (2004) pp. 415-420.

Scarpa et al. "Reliability implications in advanced embedded two-transistor-Fowler-Nordheim-NOR flash memory devices" *Solid-state Electronics* 46:1765-1773, 2002.

* cited by examiner

Fig. 4

|  | BL | WL | CG (SL) | SSG | CS | BSG /LSG | I-PW | BNW |
|---|---|---|---|---|---|---|---|---|
| Writing |  |  |  |  |  |  |  |  |
| Selected | -5/0V | -5V | 10V | 1V | Float | 0V | -5V | 10V |
| Unselected | 0V | -5V | 0V | -5V |  | 10V | 0V |  |
| Erase |  |  |  |  |  |  |  |  |
| Selected | Float | Float | -5V | Float | Float | -8V | 10V | 10V |
| Unselected | Float | Float | 6V | Float |  | 6V | 6V |  |
| Read |  |  |  |  |  |  |  |  |
| Selected | 0.5V | Vdd | 1V | Vdd | 0V | 0V | 0V | Vdd |
| Unselected | 0V | 0V | 0V | 0V |  | 1V | 0V |  |

# NON-VOLATILE MEMORY DEVICES INCLUDING LOCAL CONTROL GATES ON MULTIPLE ISOLATED WELL REGIONS AND RELATED METHODS AND SYSTEMS

RELATED APPLICATION

This U.S. non-provisional patent application claims priority under 35 U.S.C. §119 of Korean Patent Application No. 10-2006-0095901 filed on Sep. 29, 2006, the disclosure of which is hereby incorporated herein by reference in its entirety.

FIELD OF THE INVENTION

The present invention generally relates to electronic memory devices, and more particularly, to non-volatile memory devices and related systems and methods.

BACKGROUND

Advanced Electrically Erasable Programmable Read Only Memory (EEPROM) technology may be used to realize System-On-Chip (SOC) functionality. SOC technologies may require high performance, fast access, low voltage and low power operation EEPROMs, together with advanced CMOS processes. Often, a non-volatile memory may include flash memory for code storage and EEPROM memory for data storage. The EEPROM memory may require extremely high endurance (up to 1 million erase/program cycles) and byte-alterable functionality.

Traditionally, byte-alterable EEPROM memories have been based on a Floating-gate Tunnel Oxide (FLOTOX) cell and have been operated using Fowler-Nordheim (FN) tunneling both for write and erase operations. Each cell may include a tunneling area, a High Voltage (HV) select transistor, and a separate high-voltage (HV) select transistor at the drain side. Although FLOTOX memories may provide low power operation and may provide high endurance, FLOTOX memories may have a relatively large cell size.

Memory structures are discussed, for example, in the reference by Tao et al. entitled "*Device Architecture And Reliability Aspects Of A Novel* $1.22 \mu m^2$ *EEPROM Cell In* $0.18 \mu m$ *Node For Embedded Applications*" (Microelectronics Engineering, 72, 2004, pages 415-420), the disclosure of which is hereby incorporated herein in its entirety by reference. The EEPROM structure of the Tao publication may improve scalability while providing features such as byte-alterability, high endurance, and low power operation. More particularly, the EEPROM structure of the Tao publication may be based on a 2T-FN-NOR (2 transistor-FN-NOR) cell.

Further memory structures are discussed in U.S. Pat. No. 6,031,764 to Imamiya et al. entitled "Nonvolatile Semiconductor Memory Device," the disclosure of which is hereby incorporated herein in its entirety by reference. As discussed in the Imamiya patent, a nonvolatile semiconductor device may include a memory cell array with, for example, NAND memory cells, a row decoder to select and drive word lines, and data sense amplifier/latch circuits to exchange data with the selected memory cells via bit lines. The memory cell array may be divided into blocks in a word line direction. The individual blocks are formed in wells formed separately in a semiconductor substrate. Each word line driven by the row decoder may be provided continuously by means of control transistors formed in the boundary areas between blocks. Turning off the control transistors may enable the data to be erased simultaneously block by block.

Notwithstanding the memory structures discussed above, there continues to exist a need in the art for improved memory structures and methods.

SUMMARY

According to some embodiments of the present invention, an electronic system may include a semiconductor substrate including first and second electrically isolated wells having a same conductivity type. A first plurality of non-volatile memory cell transistors may be provided on the first well, and a second plurality of non-volatile memory cell transistors may be provided on the second well. A local control gate line may be electrically coupled with the first and second pluralities of non-volatile memory cell transistors, and a group selection transistor may be electrically coupled between the local control gate line and a global control gate line. More particularly, the group selection transistor may be configured to electrically couple and decouple the local control gate line and the global control gate line responsive to a group selection gate signal applied to a gate of the group selection transistor.

The first and second electrically isolated wells may have a first conductivity type, the semiconductor substrate may include a well having a second conductivity type different than the first conductivity type, and the group selection transistor may be on the well having the second conductivity type. More particularly, the first and second electrically isolated wells having the same conductivity type may be first and second electrically isolated p-type wells, the well having the second conductivity type may be an n-type well, and the group selection transistor may be a PMOS group selection transistor. The well having the second conductivity type may be between the first and second electrically isolated wells having the first conductivity type, or the first well having the first conductivity type may be between the well having the second conductivity type and the second well having the first conductivity type. The first plurality of non-volatile memory cell transistors may include 8 non-volatile memory cell transistors, the second plurality of non-volatile memory cell transistors may include 8 non-volatile memory cell transistors, and the group selection transistor may be a byte selection transistor.

In addition, a controller may be coupled to the first and second wells having the first conductivity type, to the global control gate line, and to the gate of the group selection transistor. The controller may be configured to apply different first and second electrical biases to the first and second electrically isolated wells having the first conductivity type at the same time. While applying the first and second electrical biases to the first and second electrically isolated wells, the controller may also be configured to apply a turn on signal to the gate of the group selection transistor and to apply a same control gate signal from the global control gate line through the group selection transistor to the local control gate line and to the first and second pluralities of memory cell transistors. Programmed states of the first plurality of memory cell transistors may thereby be erased while maintaining programmed states of the second plurality of memory cell transistors.

The controller may be further configured to receive address information from an input/output bus during a read operation and to provide data from at least one of the first and/or second pluralities of non-volatile memory cell transistors to the input/output bus responsive to the address information during the read operation. Moreover, a processor may be coupled to the input/output bus, and the processor may be configured to generate the address information and to provide the address information to the controller over the input/output bus. The processor may be further configured to receive the data from the controller over the input/output bus during the read operation. In addition, the controller may be configured to receive address information and data from an input/output bus during a write operation, and the controller may be configured to write the data to at least one of the first and/or second pluralities of non-volatile memory cell transistors defined by the address information. A processor coupled to the input/output bus may be configured to generate the address information and the data and to provide the address information and the data to the controller over the input/output bus during the write operation. According to some embodiments of the present invention, a processor coupled to the controller over the input/output bus may be configured to operate an electronic system such as a radiotelephone, a personal digital assistant, a digital camera, a digital audio player/recorder, a digital video recorder/player, etc.

According to some other embodiments of the present invention, a method may be provided to operate a non-volatile integrated circuit memory device including first and second pluralities of memory cell transistors on respective first and second electrically isolated wells having a same conductivity type. The method may include applying first and second electrical biases to the electrically isolated first and second wells having the same conductivity type at the same time, and the first and second electrical biases may be different. While applying the first and second electrical biases to the first and second electrically isolated wells, a same control gate signal may be applied to the first and second pluralities of memory cell transistors to thereby erase programmed states of the first plurality of memory cell transistors while maintaining programmed states of the second plurality of memory cell transistors.

The first and second electrically isolated wells may include first and second electrically isolated p-type wells. Moreover, the first plurality of non-volatile memory cell transistors may include 8 non-volatile memory cell transistors, the second plurality of non-volatile memory cell transistors may include 8 non-volatile memory cell transistors, and the group selection transistor may include a byte selection transistor.

In addition, address information may be received from an input/output bus during a read operation, and data from at least one of the first and/or second pluralities of non-volatile memory cell transistors may be provided to the input/output bus responsive to the address information during the read operation. Before receiving the address information from the input/output bus, the address information may be transmitted from a processor over the input/output bus, and the data may be retrieved from the input/output bus during the read operation after providing the data to the input/output bus. During a write operation, address information and data may be received from an input/output bus, and the data may be written to at least one of the first and/or second pluralities of non-volatile memory cell transistors defined by the address information. Before receiving the address information and the data from the input/output bus, the address information and the data may be transmitted from a processor over the input/output bus. According to some embodiments of the present invention, a processor coupled to a memory device controller over the input/output bus may be configured to operate an electronic system such as a radiotelephone, a personal digital assistant, a digital camera, a digital audio player/recorder, a digital video recorder/player, etc.

According to still other embodiments of the present invention, an electronic system may include a semiconductor substrate having first and second electrically isolated wells of a same conductivity type. A first plurality of non-volatile memory cells may be provided such that each non-volatile memory cell of the first plurality includes a non-volatile memory cell transistor coupled in series between respective word selection and sector selection transistors on the first well. A second plurality of non-volatile memory cells may be provided such that each non-volatile memory cell of the second plurality includes a non-volatile memory cell transistor coupled in series between respective word selection and sector selection transistors on the second well. A first plurality of bit lines may be coupled to respective sector selection transistors of the first plurality of memory cells, a second plurality of bit lines may be coupled to respective sector selection transistors of the second plurality of memory cells, and a local control gate line may be electrically coupled with the first and second pluralities of non-volatile memory cell transistors. A group selection transistor may be electrically coupled between the local control gate line and a global control gate line, and the group selection transistor may be configured to electrically couple and decouple the local control gate line and the global control gate line responsive to a signal applied to a gate of the group selection transistor. A row decoder may be coupled to the word selection and sector selection transistors of the first and second pluralities of non-volatile memory cells, and the row decoder may be coupled to the global control gate line. A column decoder may be coupled to the first and second electrically isolated wells, the first and second pluralities of bit lines, and the group selection gate line. A controller may be coupled to the row and column decoders. The controller may be configured to direct the column decoder to apply different electrical biases to the first and second wells and to direct the group selection transistor to provide a same control gate signal from the global control gate line over the local control gate line to the non-volatile memory cell transistors of the first and second pluralities of non-volatile memory cells while the different electrical biases are applied to the first and second wells. Programmed states of the first plurality of memory cell transistors may thereby be erased while maintaining programmed states of the second plurality of memory cell transistors.

The first and second electrically isolated wells may have a first conductivity type, the semiconductor substrate may include a well having a second conductivity type different than the first conductivity type, and the group selection transistor may be on the well having the second conductivity type. More particularly, the first and second electrically isolated wells having the same conductivity type may be first and second electrically isolated p-type wells, the well having the second conductivity type may be an n-type well, and the group selection transistor may be a PMOS group selection transistor. Moreover, the well having the second conductivity type may be between the first and second electrically isolated wells having the first conductivity type, or the first well having the first conductivity type may be between the well having the second conductivity type and the second well having the first conductivity type. The first plurality of non-volatile memory cell transistors may include 8 non-volatile memory cell transistors, the second plurality of non-volatile memory cell transistors may include 8 non-volatile memory cell transistors, and the group selection transistor may be a byte selection transistor.

The controller may be further configured to receive address information from an input/output bus during a read operation, and the controller is configured to provide data from at least one of the first and/or second pluralities of non-volatile memory cell transistors to the input/output bus responsive to the address information during the read operation. In addition, a processor may be coupled to the input/output bus. The processor may be configured to generate the address information and to provide the address information to the controller over the input/output bus, and the processor may be further configured to receive the data from the controller over the input/output bus during the read operation. In addition, the controller may be configured to receive address information and data from an input/output bus during a write operation, and the controller may be configured to write the data to at least one of the first and/or second pluralities of non-volatile memory cell transistors defined by the address information. A processor coupled to the input/output bus may be configured to generate the address information and the data and to provide the address information and the data to the controller over the input/output bus during the write operation. According to some embodiments of the present invention, a processor coupled to a memory device controller over the input/output bus may be configured to operate an electronic system such as a radiotelephone, a personal digital assistant, a digital camera, a digital audio player/recorder, a digital video recorder/player, etc.

According to yet further embodiments of the present invention, an electronic system may include first and second pluralities of non-volatile memory cell transistors, and a local control gate line electrically coupled with the first and second pluralities of non-volatile memory cell transistors. A controller may be coupled to the local control gate line, and the controller may be configured to erase programmed states of the first plurality of non-volatile memory cell transistors coupled to the local control gate line while maintaining programmed states of the second plurality of non-volatile memory cell transistors during an erase operation.

A semiconductor substrate may include first and second electrically isolated wells having a same conductivity type with the first plurality of non-volatile memory cell transistors on the first well and with the second plurality of non-volatile memory cell transistors on the second well. The controller may be further configured to apply different first and second electrical biases to the first and second electrically isolated wells having the first conductivity type at the same time during the erase operation. More particularly, the first and second electrically isolated wells may be first and second electrically isolated p-type wells. In addition, the first plurality of non-volatile memory cell transistors may include 8 non-volatile memory cell transistors, the second plurality of non-volatile memory cell transistors may include 8 non-volatile memory cell transistors, and the group selection transistor may be a byte selection transistor.

BRIEF DESCRIPTION OF THE DRAWINGS

FIG. 4 is a table illustrating signals used for write, erase, and read operations according to some embodiments of the present invention.

DETAILED DESCRIPTION

Figure 1:
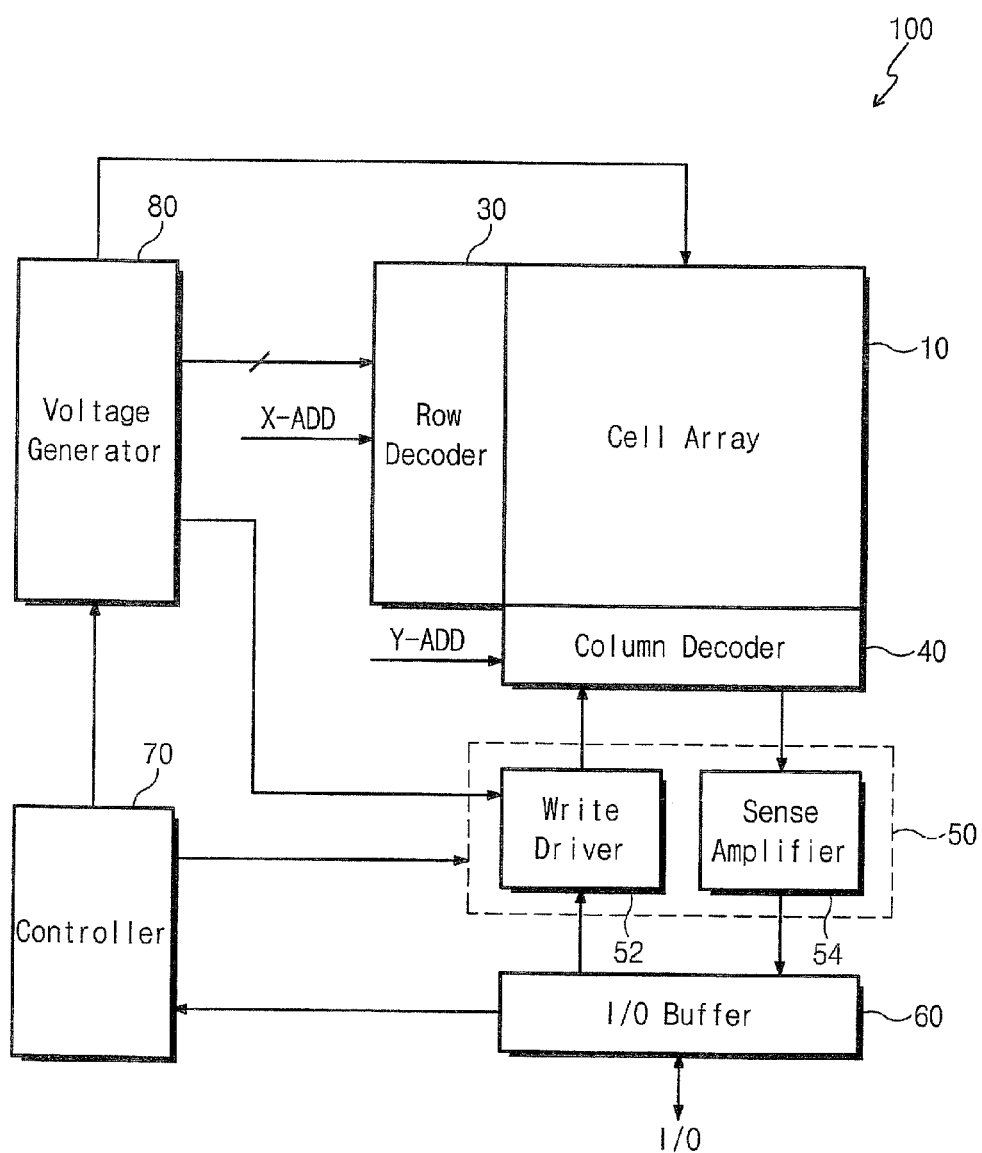
FIG. 1 is a block diagram illustrating non-volatile memory devices according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

According to some embodiments of the present invention illustrated in FIG. 1, a non-volatile memory device 100 may include a memory cell array 10, a row decoder 30, a column decoder 40, a data input/output circuit 50, an input/output buffer 60, a controller 70, and a voltage generator 80. A row address X-ADD and a column address Y-ADD for read, write, and/or erase operations may be respectively provided from the controller 70 to the row decoder 30 and the column decoder 40. Moreover, the voltage generator 80 may generate different voltage levels used for read, write, and erase operations.

The input/output circuit 50 may include a write driver 52 and a sense amplifier 54. The write driver 52 may perform write and erase operations at a selected memory cell(s) (defined by row and column addresses X-ADD and Y-ADD) under direction of the controller 70. The sense amplifier may perform read operations at a selected memory cell(s) (defined by row and column addresses X-ADD and Y-ADD).

During a read operation, for example, a memory address (including a row address X-ADD and a column address Y-ADD) defining a memory cell(s) to be read may be received at the input/output (I/O) buffer 60 (from an input/output bus I/O) and provided to the controller 70. The controller 70 may then provide the row address X-ADD to the row decoder 30 and the column address Y-ADD to the column decoder so that appropriate voltage levels from the voltage generator 80 may be provided to the memory cell array 10. The sense amplifier 54 can then read data stored in the addressed memory cell(s), and the data can be provided from the sense amplifier 54 to the input/output buffer 60 and from the input output buffer 60 to an input/output bus.

During a write operation, a memory address (including a row address X-ADD and a column address Y-ADD) defining a memory cell(s) to which data is to be written may be received at the input/output buffer 60 (from an input/output bus) and provided to the controller 70. The data to be written may also be received at the input/output buffer 60 (from the input/output bus) and provided to the write driver 52. The controller 70 may then provide the row address X-ADD to the row decoder 30 and the column address Y-ADD to the column decoder so that appropriate voltage levels from the voltage generator 80 may be provided to the memory cell array 10. The write driver 52 can then write the data to the addressed memory cell(s).

During an erase operation, a memory address (including a row address X-ADD and a column address Y-ADD) defining a memory cell(s) to which data is to be erased may be received at the input/output buffer 60 (from an input/output bus) and provided to the controller 70. The controller 70 may then provide the row address X-ADD to the row decoder 30 and the column address Y-ADD to the column decoder so that appropriate voltage levels from the voltage generator 80 may be provided to the memory cell array 10 to erase the addressed memory cell(s).

Figure 2:
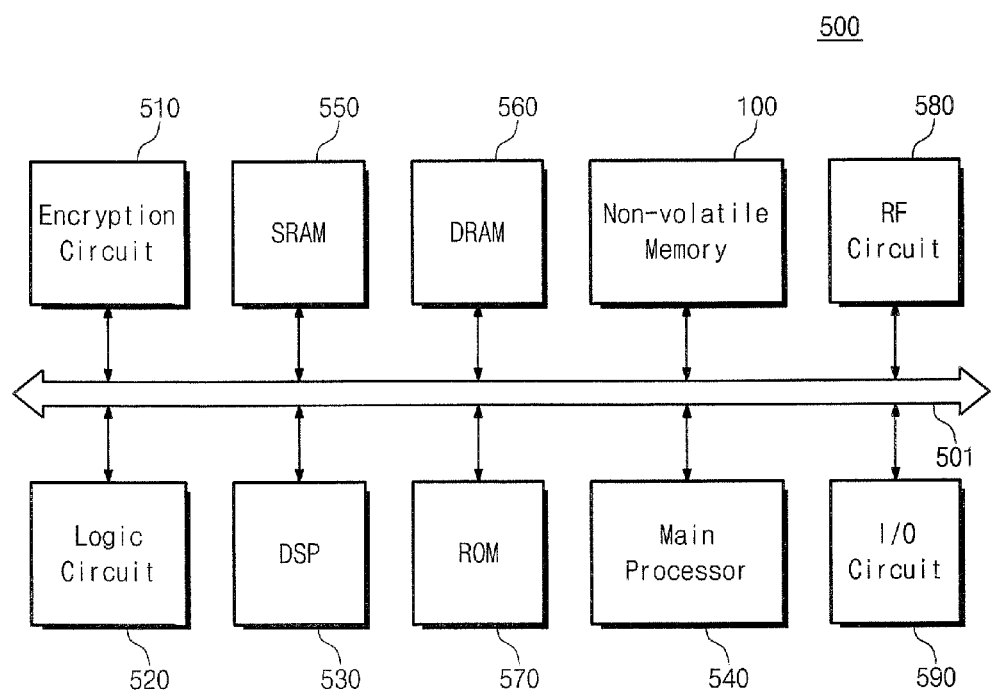
FIG. 2 is a block diagram illustrating electronic systems including non-volatile memory devices according to embodiments of the present invention.

Moreover, the non-volatile memory device 100 of FIG. 1 may be implemented as a non-volatile memory device 100 (such as non-volatile flash memory device) in an electronic system 500 as illustrated in FIG. 2 according to some embodiments of the present invention. More particularly, the memory system 500 may include an input/output bus 501 electrically coupled to the input/output buffer 60 of the non-volatile memory device 100 of FIG. 1. The memory system 500 may also include an encryption circuit 510, a logic circuit 520, a digital signal processor 530, a main processor 540, static random access memory 550, dynamic random access memory 560, read only memory 570, radio frequency circuit 580, and/or an input/output circuit 590. The non-volatile memory device 100, for example, may thus perform read, write, and/or erase operations in response to instructions/addresses received from the main processor 540 over the input/output bus 501.

While elements of an electronic system 500 are illustrated by way of example in FIG. 2, not all elements of FIG. 2 are required according to all embodiments of the present invention, and/or elements not shown in FIG. 2 may be included. The electronic system 500, for example, may be a wireless communications device such as a wireless radiotelephone, a wireless personal digital assistant (for example running the Palm® Operating System or the Windows® Mobile Operating System), a wireless handheld computer, etc., and the non-volatile memory 100 may be used to store operating code, identification information, serial numbers, contact information (such as names, addresses, telephone numbers, e-mail addresses, etc.), profile information, etc. Accordingly, the radio frequency circuit 580 may provide wireless communications according to a long range communications standard (such as a cellular radiotelephone standard), a short range communications standard (such as the Bluetooth standard), and/or a WiFi standard. In a wireless communications device, a separate input/output circuit 590 may be omitted, or a separate input/output circuit 590 may provide wired or other coupling to other computing devices (such as a persona/laptop computer for data transfer).

According to other embodiments of the present invention, the electronic system 500 may be a flash memory card system controlled by an outside host coupled directly to the input/output bus 501. For example, the input/output bus 501 may be integrated with a connector providing a removable electrical and mechanical connection with the outside host which may be a digital camera, a digital video recorder/player, a digital audio player/recorder, a radiotelephone, etc. As a flash memory card system, the non-volatile memory device 100 of the electronic system 500 may be configured to store digital photographs, digital video, digital audio, radiotelephone data (such as radiotelephone identification, serial numbers, contact information, a personal digital assistant, a hand held computer etc.), operating code, profile information, etc. Because the electronic system 500 may be controlled by an outside host electrically and mechanically coupled to the input/output bus 590, elements such as the radio frequency circuit 580, the input/output circuit 590, and/or the main processor 540 may be omitted.

As discussed above, the non-volatile memory device 100 of FIG. 1 may be defined as including controller 70 separate from row decoder 30, column decoder 40, data input/output circuit 50, input/output buffer 60, and/or voltage generator 80. The term controller, however, may be defined to include the controller 70 together with one or more of row decoder 30, column decoder 40, data input/output circuit 50, input/output buffer 60, and/or voltage generator 80. For example, the term controller may be defined to include controller 70, row decoder 30, column decoder 40, data input/output circuit 50, input/output buffer 60, and voltage generator 80. Cell arrays according to various embodiments of the present invention will now be discussed in greater detail with respect to FIGS. 3A-3B, 5A-5B, and 6A-6B.

Figure 3A:
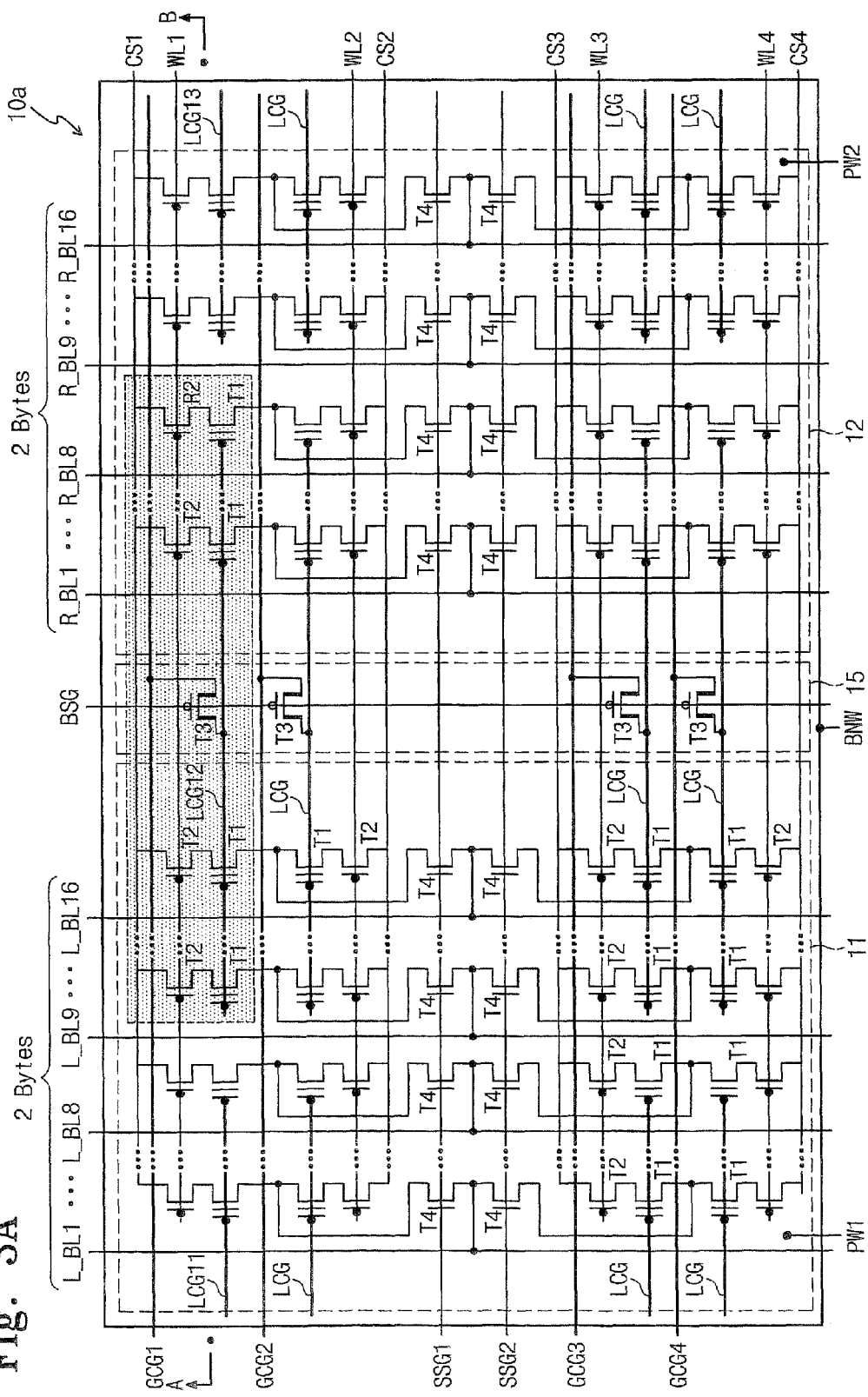
FIG. 3A is a schematic diagram of a memory cell array according to some embodiments of the present invention.
Figure 3B:
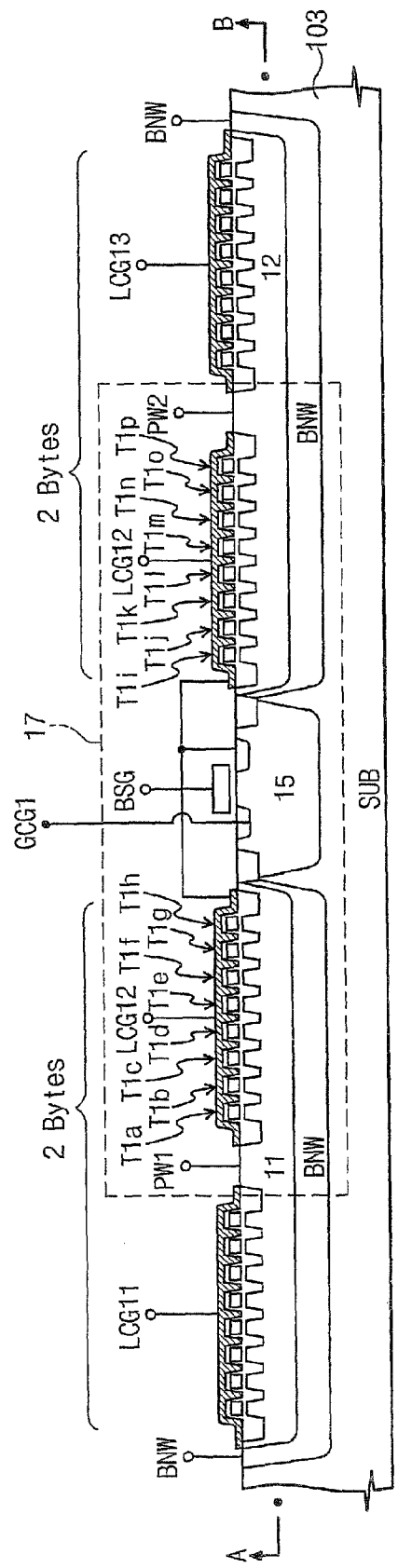
FIG. 3B is a cross-sectional view of a portion of the memory cell array of FIG. 3A taken along section line A-B.

FIG. 3A is a schematic diagram of a memory cell array 10*a* according to some embodiments of the present invention, and FIG. 3B is a cross-sectional view of a portion of the memory cell array of FIG. 3A taken along section line A-B of FIG. 3A. According to some embodiments of the present invention illustrated in FIGS. 3A and 3B, a non-volatile integrated circuit memory cell array 10*a* may include a semiconductor substrate (SUB) 103 having first and second electrically isolated p-type wells 11 and 12 separated by a high voltage n-well 15. Moreover, non-volatile memory cell transistors T1 may be provided on the p-type wells 11 and 12 together with word selection transistors T2, and byte-select transistors T3 may be provided on the high voltage n-well 15. Electrical isolation may be provided between the p-type wells 11 and 12 by providing the p-type wells 11 and 12 in a buried n-type well BNW. In addition, gates of sector selection transistors T4 on the p-type wells may be coupled to respective sector selection gate lines SSG1 and SSG2. Moreover, the region of FIG. 3B defined by the dotted line box 17 corresponds to portions of FIG. 3A along section line A-B in the shaded region.

As shown in FIG. 3A, eight bytes of non-volatile memory cell transistors T1 and respective word selection transistors T2 may be provided in each of the p-type wells 11 and 12. Moreover, control gates of each of the non-volatile memory cell transistors T1 of a same byte of non-volatile memory cell transistors T1 may be coupled to a same local control gate line LCG, and each byte of non-volatile memory cell transistors T1 in a same p-type well may be coupled to a different local control gate line LCG. Each local control gate line LCG, however, may be coupled to bytes of non-volatile memory cell transistors T1 in at least two different p-type wells. In addition, a gate of each word selection transistor T2 in a row is coupled to a respective word line WL1, WL2, WL3, or WL4; a gate of each byte selection transistor T3 is coupled to a respective byte selection gate line BSG; and a gate of each sector selection transistor T4 is coupled to a respective sector selection gate line SSG1 or SSG2. Each word selection transistor T2 is electrically coupled between a non-volatile memory cell transistor T1 and a respective common source line CS1, CS2, CS3, or CS4. Each sector selection transistor T4 is electrically coupled between a common source/drain of adjacent memory cell transistors T1 (in different rows of a same sector) and a respective one of the bit lines L_BL1-L_BL16 and R_BL1-R_BL16.

Connections of a same local control gate line LCG to bytes of non-volatile memory cell transistors T1 in the different p-type wells 11 and 12 are illustrated in greater detail in the cross-sectional view of FIG. 3B. In particular, a first byte of non-volatile memory cell transistors T1*a*-T1*h* may be provided on p-type well 11, and a second byte of non-volatile memory cell transistors T1*i*-T1*p* may be provided on p-type well 12, with the p-type wells 11 and 12 being electrically isolated. Moreover, a same local control gate line LCG12 may be provided on all of the non-volatile memory cell transistors T1*a*-T1*h* and T1*i*-T1*p*, and the local control gate line LCG12 may be coupled to global control gate line GCG1 through a respective byte-select transistor T3. Another byte of non-volatile memory cell transistors on p-type well 11 may be coupled to local control gate line LCG11 separate from local control gate line LCG12, and another byte of non-volatile memory cell transistors on p-type well 12 may be coupled to a local control gate line LCG13 separate from local control gate line LCG12. While not shown in FIGS. 3A and 3B, each of the local control gate lines LCG11, LCG12, and LCG13 may be coupled to the same global control gate line GCG1 using respective byte-select transistors that are separately controlled. Accordingly, one or more of the local control gate lines LCG11, LCG12, and LCG13 may be coupled to the global control gate line GCG1 while others of the local control gate lines LCG11, LCG12, and LCG13 may be decoupled from the global control gate line GCG1.

While a byte of non-volatile memory cell transistors (i.e., eight transistors) in a same p-well may be coupled to a local control gate line according to embodiments of the present invention illustrated in FIGS. 3A and 3B, other numbers of non-volatile memory cell transistors may be coupled to local control gate lines according to other embodiments of the present invention. Each local control gate line, for example, may be coupled to a group of four, sixteen, or thirty two non-volatile memory cell transistors in a same p-well. While all elements of the non-volatile memory cells T1 are not separately labeled, each non-volatile memory cell transistor T1 may include a tunnel insulating layer (such as a tunnel oxide layer) on a channel region of the respective p-type well; a floating-gate (such as a floating polysilicon gate) and/or charge-trap layer (such as a silicon nitride layer) on the tunnel insulating layer; an interlayer dielectric layer (such as a silicon oxide layer) on the floating-gate/charge-trap layer; and the respective control gate on the interlayer dielectric layer. Structures of non-volatile memory cell transistors are discussed, by way of example, in the reference by Tao et al. entitled "*Device Architecture And Reliability Aspects Of A Novel 1.22 $\mu m^2$ EEPROM Cell In 0.18 $\mu m$ Node For Embedded Applications*" (Microelectronics Engineering, 72, 2004, pages 415-420), the disclosure of which is hereby incorporated herein in its entirety by reference.

The memory cell array 10*a* of FIGS. 3A-3B may be used as the memory cell array 10 of FIG. 1. If the memory cell array 10*a* of FIGS. 3A-3B is implemented as the cell array 10 of FIG. 1, the word lines WL1, WL2, WL3, and WL4, the common source lines CS1, CS2, CS3, and CS4, the sector selection gate lines SSG1 and SSG2, and the global control gate lines GCG1, GCG2, GCG3, and GCG4 may be separately coupled to and/or controlled by the row decoder 30. Moreover, the byte selection gate line(s) BSG, the bit lines L_BL1-L_BL16 and R_BL1-R_BL16, and biases of the p-type wells 11 and 12 may be separately coupled to and/or controlled by the column decoder 40. A bias of the buried n-type well BNW may be applied directly by the voltage generator 80. FIG. 4 is a table illustrating signals used for write, erase, and read operations according to some embodiments of the present invention. Write, erase, and read operations for the memory cell array 10a used in the memory device 100 of FIG. 1 will be discussed in greater detail below with respect to the table of FIG. 4.

By way of example, operations of writing data to memory cell transistors T1a-T1h in p-type well 11 and coupled to local control gate line LCG12 will be discussed with reference to the write signals of FIG. 4. At initiation of a write operation, address information (including a row address X-ADD and a column address Y-ADD) and data to be written are received at the I/O buffer 60. The address information is provided to the controller 70 which in turn provides the row address X-ADD to the row decoder and the column address Y-ADD to the column decoder. The data to be written is provided to the write driver 52.

The row decoder 30 applies the write signals from the voltage generator 80 to the selected and unselected common source lines CS1-CS4 (CS(SL)), word lines WL1-WL4 (WL), sector selection gate lines SSG1-SSG2 (SSG), and global control gate lines GCG1-GCG4 (CG) according to the row address X-ADD as shown in FIG. 4. The column decoder 40 and the write driver 52 apply the write signals from the voltage generator 80 to the selected and unselected bit lines L_BL1-L_BL16 and R_BL1-R_BL16 (BL), byte selection gate lines BSG (BSG), and p-type wells 11 and 12 (I-PW) according to the column address Y-ADD as shown in FIG. 4. The voltage generator 80 may apply the appropriate bias to the buried n-type well BNW directly.

When writing data to memory cell transistors T1a-T1h, the row decoder 30 applies 10 V to the selected global control gate line GCG1 and 0 V to the unselected global control gate lines GCG2-GCG4; and the row decoder 30 applies 1V to the selected sector selection gate line SSG1 and −5 V to the unselected sector selection gate line SSG2. Moreover, the column decoder 40 applies 0 V to the unselected bit lines L_BL1-L_BL8 and R_BL1-R_BL16; the column decoder 40 applies 0 V to the selected byte selection gate line BSG (between p-type wells 11 and 12) and 10 V to unselected byte selection gate lines (to the left of p-type well 11 and to the right of p-type well 12); and the column decoder 40 applies −5 V to the selected p-type well 11 and 0 V to the unselected p-type well 12. In addition, the column decoder 40 applies −5 V or 0 V to the selected bit lines L_BL9-L_BL16 according to the received data being written. By providing different voltage biases to selected p-type well 11 and to unselected p-type well 12, data may be written to memory cell transistors T1a-T1h coupled to local control gate line LCG12 without writing data to memory cell transistors T1i-T1p also coupled to local control gate line LCG12.

While not shown in FIGS. 3A and 3B, the local gate control line LCG11 may be coupled to the global control gate line GCG1 through a byte selection transistor to the left of the p-type well 11, and the local gate control line LCG13 may be coupled to the global control gate line GCG1 through a byte selection transistor to the right of the p-type well 12. Moreover, the unselected byte selection transistors coupled to the local control gates LCG11 and LCG13 may operate responsive to respective unselected byte selection gate lines to the left of the p-type well 11 and to the right of p-type well 12. By separately controlling the local control gate lines LCG11 (unselected) and LCG12 (selected) for separate bytes of memory cell transistors in a same row and in a same p-type well 11, data may be written to the selected byte of memory cell transistors (e.g., memory cell transistors T1a-T1h coupled to local control gate line LCG12) without affecting data of the unselected byte of memory cell transistors (e.g., memory cell transistors coupled to local control gate line LCG11).

By way of example, operations of erasing data of memory cell transistors T1a-T1h in p-type well 11 and coupled to local control gate line LCG12 will be discussed with reference to the erase signals of FIG. 4. At initiation of an erase operation, address information (including a row address X-ADD and a column address Y-ADD) is received at the I/O buffer 60. The address information is provided to the controller 70 which in turn provides the row address X-ADD to the row decoder and the column address Y-ADD to the column decoder.

The row decoder 30 applies the erase signals from the voltage generator 80 to the selected and unselected common source lines CS1-CS4 (CS), word lines WL1-WL4 (WL), sector selection gate lines SSG1-SSG2 (SSG), and global control gate lines GCG1-GCG4 (CG(SL)) according to the row address X-ADD as shown in FIG. 4. The column decoder 40 and the write driver 52 apply the erase signals from the voltage generator 80 to the selected and unselected bit lines L_BL1-L_BL16 and R_BL1-R_BL16 (BL), byte selection gate lines BSG (BSG), and p-type wells 11 and 12 (I-PW) according to the column address Y-ADD as shown in FIG. 4. The voltage generator 80 may apply the appropriate bias to the buried n-type well BNW directly.

When erasing data of memory cell transistors T1a-T1h, the row decoder 30 applies −5 V to the selected global control gate line GCG1 and 6 V to the unselected global control gate lines GCG2-GCG4. The column decoder 40 applies −8 V to the selected byte selection gate line BSG (between p-type wells 11 and 12) and 6 V to unselected byte selection gate lines (to the left of p-type well 11 and to the right of p-type well 12); and the column decoder 40 applies 10 V to the selected p-type well 11 and 6 V to the unselected p-type well 12. By providing different voltage biases to selected p-type well 11 and to unselected p-type well 12, data may be erased from memory cell transistors T1a-T1h coupled to local control gate line LCG12 without erasing data from memory cell transistors T1i-T1p also coupled to local control gate line LCG12.

As discussed above, the local gate control line LCG11 may be coupled to the global control gate line GCG1 through a byte selection transistor to the left of the p-type well 11, and the local gate control line LCG13 may be coupled to the global control gate line GCG1 through a byte selection transistor to the right of the p-type well 12. Moreover, the unselected byte selection transistors coupled to the local control gates LCG11 and LCG13 may operate responsive to respective unselected byte selection gate lines to the left of the p-type well 11 and to the right of p-type well 12. By separately controlling the local control gate lines LCG11 (unselected) and LCG12 (selected) for separate bytes of memory cell transistors in a same row and in a same p-type well 11, data may be erased from the selected byte of memory cell transistors (e.g., memory cell transistors T1a-T1h coupled to local control gate line LCG12) without affecting data of the unselected byte of memory cell transistors (e.g., memory cell transistors coupled to local control gate line LCG11).

By way of example, operations of reading data from memory cell transistors T1a-T1h in p-type well 11 and coupled to local control gate line LCG12 will be discussed with reference to the read signals of FIG. 4. At initiation of a read operation, address information (including a row address X-ADD and a column address Y-ADD) is received at the I/O buffer 60. The address information is provided to the controller 70 which in turn provides the row address X-ADD to the row decoder and the column address Y-ADD to the column decoder.

The row decoder 30 applies the read signals from the voltage generator 80 to the selected and unselected common source lines CS1-CS4 (CS), word lines WL1-WL4 (WL), sector selection gate lines SSG1-SSG2 (SSG), and global control gate lines GCG1-GCG4 (CG) according to the row address X-ADD as shown in FIG. 4. The column decoder 40 applies the read signals from the voltage generator 80 to the selected and unselected bit lines L_BL1-L_BL16 and R_BL1-R_BL16 (BL), byte selection gate lines BSG (BSG), and p-type wells 11 and 12 (I-PW) according to the column address Y-ADD as shown in FIG. 4. The voltage generator 80 may apply the appropriate bias to the buried n-type well BNW directly.

When reading data from memory cell transistors T1a-T1h, the row decoder 30 applies 1 V to the selected global control gate line GCG1 and 0 V to the unselected global control gate lines GCG2-GCG4; the row decoder 30 applies the supply voltage Vdd to the selected sector selection gate line SSG1 and 0 V to the unselected sector selection gate line SSG2; and the row decoder applies the supply voltage Vdd to the selected word line WL1 and 0 V to the unselected word lines WL2-WL4. Moreover, the column decoder 40 applies 0.5 V to the selected bit lines L_BL9-L_BL16 and 0 V to the unselected bit lines L_BL1-L_BL8 and R_BL1-R_BL16; the column decoder 40 applies 0 V to the selected byte selection gate line BSG (between p-type wells 11 and 12) and 1 V to unselected byte selection gate lines (to the left of p-type well 11 and to the right of p-type well 12); and the column decoder 40 applies 0 V to the selected and unselected p-type wells 11 and 12. Voltages of the selected bit lines L_BL9-L_BL16 may then be sensed by sense amplifier 50 to read data from the selected memory cell transistors T1a-T1h, and the read data may be provided as output from the I/O buffer 60.

Figure 5A:
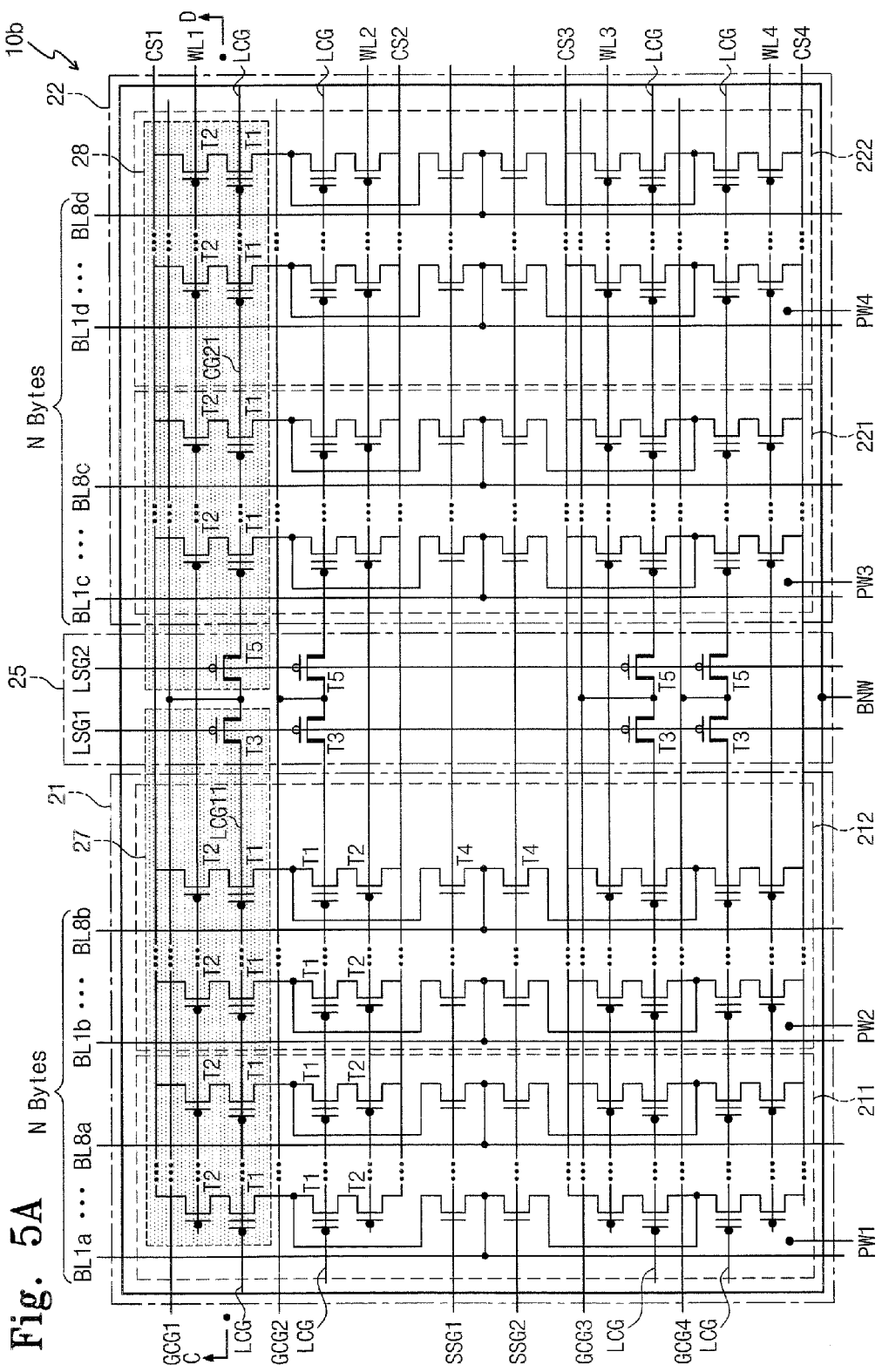
FIG. 5A is a schematic diagram of a memory cell array according to some other embodiments of the present invention.
Figure 5B:
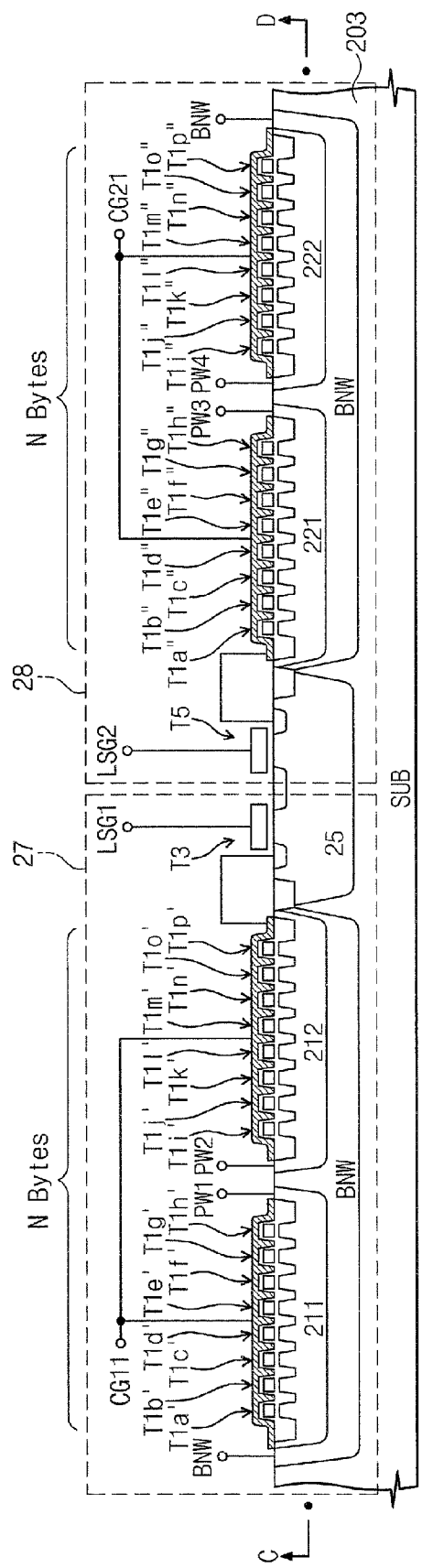
FIG. 5B is a cross-sectional view of a portion of the memory cell array of FIG. 4A taken along section line C-D.

FIG. 5A is a schematic diagram of a memory cell array 10b according to some embodiments of the present invention, and FIG. 5B is a cross-sectional view of a portion of the memory cell array of FIG. 5A taken along section line C-D of FIG. 5A. According to some embodiments of the present invention illustrated in FIGS. 5A and 5B, a non-volatile integrated circuit memory cell array 10b may include a semiconductor substrate (SUB) 203 having p-type wells 211, 212, 213, and 214 electrically isolated in buried n-type well(s) BNW. Moreover, non-volatile memory cell transistors T1 may be provided on the p-type wells 211, 212, 221, and 222 together with word selection transistors T2, and byte-select transistors T3 and T5 may be provided on the high voltage n-well 25. In addition, gates of sector selection transistors T4 on the p-type wells 211, 212, 221, and 222 may be coupled to respective sector selection gate lines SSG1 and SSG2. Moreover, the regions of FIG. 5B defined by the dotted line boxes 27 and 28 correspond to portions of shaded regions 27 and 28 of FIG. 5A along section line C-D.

As shown in FIG. 5A, four bytes of non-volatile memory cell transistors T1 and respective word selection transistors T2 may be provided in each of the p-type wells 211, 212, 221, and 222. Moreover, control gates of each of the non-volatile memory cell transistors T1 of a same byte of non-volatile memory cell transistors T1 may be coupled to a same local control gate line LCG, and each byte of non-volatile memory cell transistors T1 in a same p-type well may be coupled to a different local control gate line LCG. Each local control gate line LCG, however, may be coupled to bytes of non-volatile memory cell transistors T1 in at least two different p-type-wells. As shown in FIGS. 5A and 5B, for example, local control gate line LCG11 may be coupled to a first byte of memory cell transistors T1 in p-type well 212 and to a second byte of memory cell transistors T1 in p-type well 211, and local control gate line LCG21 may be coupled to a first byte of memory cell transistors T1 in p-type well 221 and to a second byte of memory cell transistors T1 in p-type well 222.

In addition, a gate of each word selection transistor T2 in a row is coupled to a respective word line WL1, WL2, WL3, or WL4; a gate of each byte selection transistor T3 is coupled to local selection gate line LSG1; a gate of each byte selection transistor T5 is coupled to local selection gate line LSG2; and a gate of each sector selection transistor T4 is coupled to a respective sector selection gate line SSG1 or SSG2. Each word selection transistor T2 is electrically coupled between a non-volatile memory cell transistor T1 and a respective common source line CS1, CS2, CS3, or CS4. Each sector selection transistor T4 is electrically coupled between a common source/drain of adjacent memory cell transistors T1 (in different rows of a same sector) and a respective one of the bit lines BL1a-BL8a, BL1b-BL8b, BL1c-BL8c, and BL1d-BL8d.

Connections of a same local control gate line LCG to bytes of non-volatile memory cell transistors T1 in the different p-type wells 211 and 212 or in the different p-type wells 221 and 222 are illustrated in greater detail in the cross-sectional view of FIG. 5B. In particular, local control gate line LCG11 may be coupled to gates of a first byte of non-volatile memory cell transistors T1a'-T1h' on p-type well 211 and to gates of a second byte of non-volatile memory cell transistors T1i'-T1p' on p-type well 212, with the p-type wells 211 and 212 being electrically isolated. Similarly, local control gate line LCG21 may be coupled to gates of a first byte of non-volatile memory cell transistors T1a"-T1h" on p-type well 221 and to gates of a second byte of non-volatile memory cell transistors T1i"-T1p" on p-type well 222, with the p-type wells 221 and 222 being electrically isolated. Moreover, local control gate line LCG11 may be coupled to global control gate line GCG1 through a respective byte-select transistor T3, and local control gate line LCG21 may be separately coupled to global control gate line GCG1 through a respective byte-select transistor T5. Accordingly, one of the local control gate lines LCG11 and LCG12 may be coupled to the global control gate line GCG1 while the other of the local control gate lines LCG11 and LCG12 may be decoupled from the global control gate line GCG1.

While a byte of non-volatile memory cell transistors (i.e., eight transistors) in a same p-well may be coupled to a local control gate line according to embodiments of the present invention illustrated in FIGS. 5A and 5B, other numbers of non-volatile memory cell transistors may be coupled to local control gate lines according to other embodiments of the present invention. Each local control gate line, for example, may be coupled to a group of four, sixteen, or thirty two non-volatile memory cell transistors in a same p-well. While all elements of the non-volatile memory cells T1 are not separately labeled, each non-volatile memory cell transistor T1 may include a tunnel insulating layer (such as a tunnel oxide layer) on a channel region of the respective p-type well; a floating-gate (such as a floating polysilicon gate) and/or charge-trap layer (such as a silicon nitride layer) on the tunnel insulating layer; an interlayer dielectric layer (such as a silicon oxide layer) on the floating-gate/charge-trap layer; and the respective control gate on the interlayer dielectric layer. Structures of non-volatile memory cell transistors are discussed, by way of example, in the reference by Tao et al. entitled "*Device Architecture And Reliability Aspects Of A Novel* 1.22 $\mu m^2$ *EEPROM Cell In* 0.18 $\mu m$ *Node For Embed-* ded Applications" (Microelectronics Engineering, 72, 2004, pages 415-420), the disclosure of which is hereby incorporated herein in its entirety by reference.

The memory cell array 10b of FIGS. 5A-5B may be used as the memory cell array 10 of FIG. 1. If the memory cell array 10b of FIGS. 5A-5B is implemented as the cell array 10 of FIG. 1, the word lines WL1, WL2, WL3, and WL4, the common source lines CS1, CS2, CS3, and CS4, the sector selection gate lines SSG1 and SSG2, and the global control gate lines GCG1, GCG2, GCG3, and GCG4 may be separately coupled to and/or controlled by the row decoder 30. Moreover, the local selection gate lines LSG1 and LSG2, the bit lines BL1a-BL8a, BL1b-BL8b, BL1c-BL8c, and BL1d-BL8d, and biases PW1, PW2, PW3, and PW4 of the p-type wells 211, 212, 221, and 222 may be separately coupled to and/or controlled by the column decoder 40. A bias BNW of the buried n-type well 25 may be applied directly by the voltage generator 80. Signals of FIG. 4 may be used for write, erase, and read operations for a memory device including the memory cell array 10b of FIGS. 5A and 5B according to some embodiments of the present invention. Write, erase, and read operations for the memory cell array 10b used in the memory device 100 of FIG. 1 will be discussed in greater detail below with respect to the table of FIG. 4.

By way of example, operations of writing data to memory cell transistors T1a'-T1h' in p-type well 211 and coupled to local control gate line LCG11 will be discussed with reference to the write signals of FIG. 4. At initiation of a write operation, address information (including a row address X-ADD and a column address Y-ADD) and data to be written are received at the I/O buffer 60. The address information is provided to the controller 70 which in turn provides the row address X-ADD to the row decoder and the column address Y-ADD to the column decoder. The data to be written is provided to the write driver 52.

The row decoder 30 applies the write signals from the voltage generator 80 to the selected and unselected common source lines CS1-CS4 (CS), word lines WL1-WL4 (WL), sector selection gate lines SSG1-SSG2 (SSG), and global control gate lines GCG1-GCG4 (CG) according to the row address X-ADD as shown in FIG. 4. The column decoder 40 and the write driver 52 apply the write signals from the voltage generator 80 to the selected and unselected bit lines BL1a-BL8a, BL1b-BL8b, BL1c-BL8c, and BL1d-BL8d, (BL), local selection gate lines LSG1 and LSG2 (LSG), and p-type wells 211 (signal line PW1), 212 (signal line PW2), 221 (signal line PW3), and 222 (signal line PW4), (I-PW) according to the column address Y-ADD as shown in FIG. 4. The voltage generator 80 may apply the appropriate bias BNW to the buried n-type well 25 (signal line BNW) directly.

When writing data to memory cell transistors T1a'-T1h', the row decoder 30 applies 10 V to the selected global control gate line GCG1 and 0 V to the unselected global control gate lines GCG2-GCG4; and the row decoder 30 applies 1V to the selected sector selection gate line SSG1 and −5 V to the unselected sector selection gate line SSG2. Moreover, the column decoder 40 applies 0 V to the unselected bit lines BL1b-BL8b, BL1c-BL8c, and BL1d-BL8d; the column decoder 40 applies 0 V to the selected local selection gate line LSG1 and 10 V to unselected local selection gate line LSG2; and the column decoder 40 applies −5 V to the selected p-type well 211 and 0 V to the unselected p-type wells 212, 221, and 222. In addition, the column decoder 40 applies −5 V or 0 V to the selected bit lines BL1a-BL8a according to the received data being written. By providing different voltage biases to selected p-type well 211 and to unselected p-type well 212, data may be written to memory cell transistors T1a'-T1h' coupled to local control gate line LCG11 without writing data to memory cell transistors T1i'-T1p' also coupled to local control gate line LCG11.

By way of example, operations of erasing data of memory cell transistors T1a'-T1h' in p-type well 211 and coupled to local control gate line LCG11 will be discussed with reference to the erase signals of FIG. 4. At initiation of an erase operation, address information (including a row address X-ADD and a column address Y-ADD) is received at the I/O buffer 60. The address information is provided to the controller 70 which in turn provides the row address X-ADD to the row decoder and the column address Y-ADD to the column decoder.

The row decoder 30 applies the erase signals from the voltage generator 80 to the selected and unselected common source lines CS1-CS4 (CS), word lines WL1-WL4 (WL), sector selection gate lines SSG1-SSG2 (SSG), and global control gate lines GCG1-GCG4 (CG) according to the row address X-ADD as shown in FIG. 4. The column decoder 40 and the write driver 52 apply the erase signals from the voltage generator 80 to the selected and unselected bit lines BL1a-BL8a, BL1b-BL8b, BL1c-BL8c, and BL1d-BL8d (BL), local selection gate lines LSG1 and LSG2 (LSG), and p-type wells 211 (signal line PW1), 212 (signal line PW2), 221 (signal line PW3), and 222 (signal line PW4), (I-PW), according to the column address Y-ADD as shown in FIG. 4. The voltage generator 80 may apply the appropriate bias BNW to the buried n-type well 25 directly.

When erasing data of memory cell transistors T1a'-T1h', the row decoder 30 applies −5 V to the selected global control gate line GCG1 and 6 V to the unselected global control gate lines GCG2-GCG4. The column decoder 40 applies −8 V to the selected local selection gate line LSG1 and 6 V to unselected local selection gate line LSG2; and the column decoder 40 applies 10 V to the selected p-type well 211 and 6 V to the unselected p-type wells 212, 221, and 222. By providing different voltage biases to selected p-type well 211 and to unselected p-type well 212, data may be erased from memory cell transistors T1a'-T1h' coupled to local control gate line LCG11 without erasing data from memory cell transistors T1i'-T1p' also coupled to local control gate line LCG11.

By way of example, operations of reading data from memory cell transistors T1a'-T1h' in p-type well 211 and coupled to local control gate line LCG11 will be discussed with reference to the read signals of FIG. 4. At initiation of a read operation, address information (including a row address X-ADD and a column address Y-ADD) is received at the I/O buffer 60. The address information is provided to the controller 70 which in turn provides the row address X-ADD to the row decoder and the column address Y-ADD to the column decoder.

The row decoder 30 applies the read signals from the voltage generator 80 to the selected and unselected common source lines CS1-CS4 (CS), word lines WL1-WL4 (WL), sector selection gate lines SSG1-SSG2 (SSG), and global control gate lines GCG1-GCG4 (CG) according to the row address X-ADD as shown in FIG. 4. The column decoder 40 applies the read signals from the voltage generator 80 to the selected and unselected bit lines BL1a-BL8a, BL1b-BL8b, BL1c-BL8c, and BL1d-BL8d (BL), local selection gate lines LSG1 and LSG2 (LSG), and p-type wells 211 (signal line PW1), 212 (signal line PW2), 221 (signal line PW3), and 222 (signal line PW4), (I-PW), according to the column address Y-ADD as shown in FIG. 4. The voltage generator 80 may apply the appropriate bias to the buried n-type well BNW directly.

When reading data from memory cell transistors T1a'-T1h', the row decoder 30 applies 1 V to the selected global control gate line GCG1 and 0 V to the unselected global control gate lines GCG2-GCG4; the row decoder 30 applies the supply voltage Vdd to the selected sector selection gate line SSG1 and 0 V to the unselected sector selection gate line SSG2; and the row decoder applies the supply voltage Vdd to the selected word line WL1 and 0 V to the unselected word lines WL2-WL4. Moreover, the column decoder 40 applies 0.5 V to the selected bit lines BL1a-BL8a and 0 V to the unselected bit lines BL1b-BL8b, BL1c-BL8c, and BL1d-BL8d; the column decoder 40 applies 0 V to the selected local selection gate line LSG1 and 1 V to unselected byte selection gate line LSG2; and the column decoder 40 applies 0 V to the selected and unselected p-type wells 211, 212, 221, and 222. Voltages of the selected bit lines BL1a-BL8a may then be sensed by sense amplifier 50 to read data from the selected memory cell transistors T1a'-T1h', and the read data may be provided as output from the I/O buffer 60.

Figure 6A:
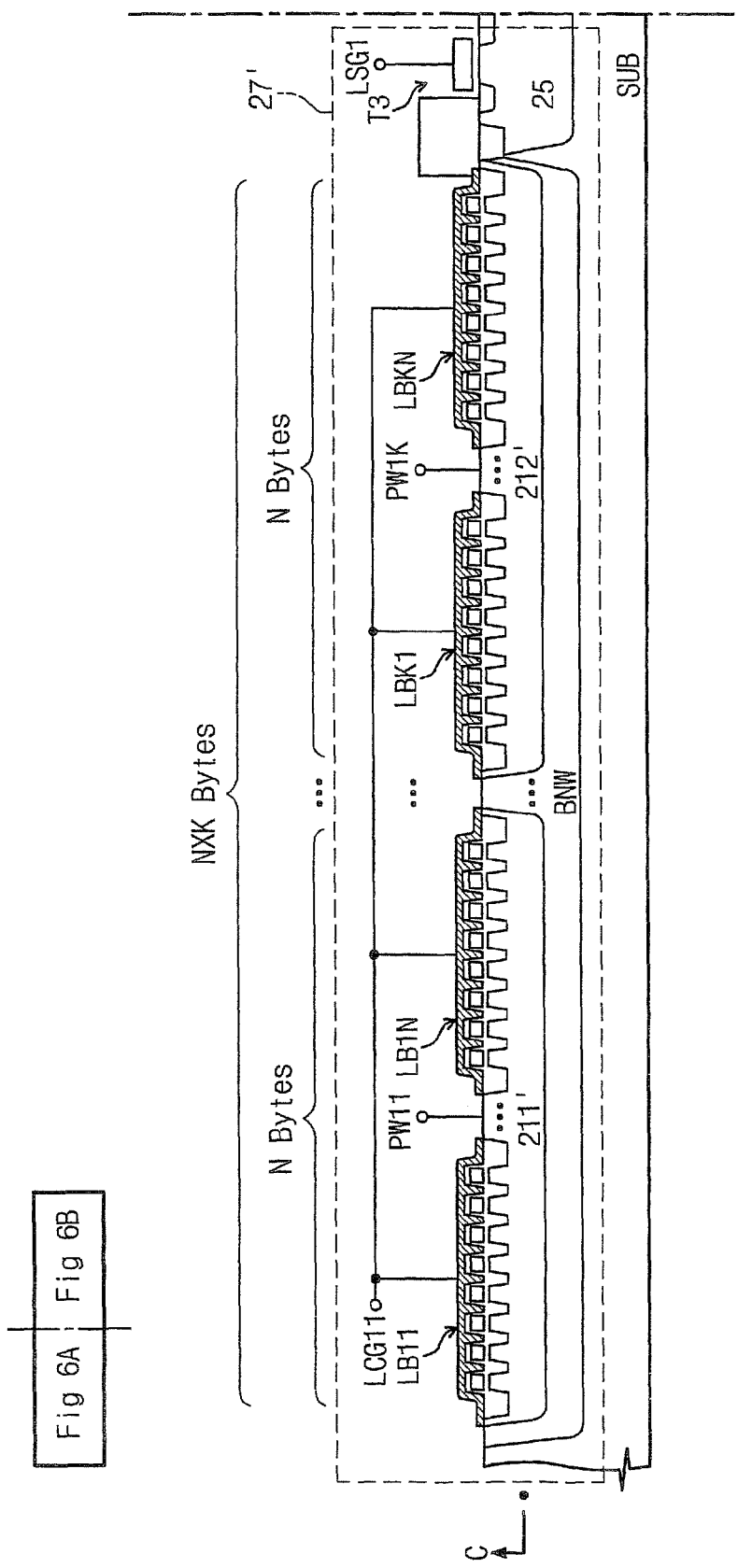
FIGS. 6A and 6B are respective halves of a cross-sectional view of a memory cell array according to still other embodiments of the present invention.
Figure 6B:
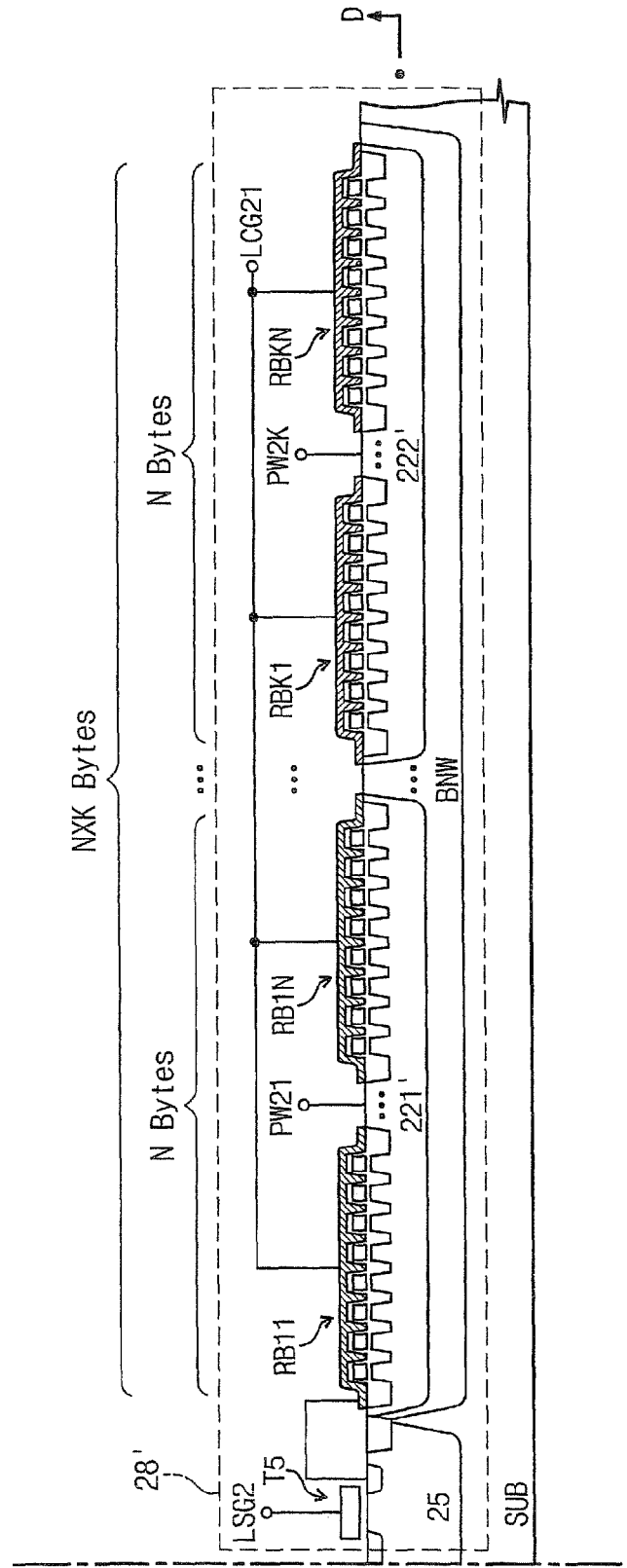

FIGS. 6A and 6B are respective halves of a cross-sectional view of memory cells according to still other embodiments of the present invention. More particularly, FIGS. 6A and 6B illustrate embodiments of the memory cell array 10b of FIG. 5A expanded to include multiple bytes of non-volatile memory cell transistors T1 in a same row and coupled to a same local control gate line LCG11 or LCG121 in each of the p-type wells 211', 212', 221', and 222' on substrate SUB. In FIGS. 6A and 6B, the regions defined by the dotted line boxes 27' and 28' correspond to portions of shaded regions 27 and 28 of FIG. 5A along section line C-D.

As shown in FIGS. 6A and 6B, bytes LB11 to LB1N of memory cell transistors may be provided on p-type well 211', bytes LBK1 to LBKN of memory cell transistors may be provided on p-type well 212', and bytes LB11 to LB1N and LBK1 to LBKN may be coupled to a same local control gate line LCG11. Similarly, bytes RB11 to RB1N of memory cell transistors T1 may be provided on p-type well 221', bytes RBK1 to RBKN of memory cell transistors T1 may be provided on p-type well 222', and bytes RB11 to RB1N and RBK1 to RBKN may be coupled to a same local control gate line LCG21. Moreover, the local control gate line LCG11 may be coupled to the global control gate line GCG1 through byte select transistor T3, and the local control gate line LCG21 may be separately coupled to the global control gate line GCG1 through byte select transistor T5.

With the memory cell array 10b of FIG. 5A including the row layout of FIGS. 6A and 6B, memory write, erase, and read operations may be performed as discussed above with respect to FIG. 4. During a write operation for the structure of FIG. 6A, for example, data may be written to memory cell transistors of bytes LBK1 and/or LBKN (in p-type well 212') without writing data to memory cell transistors LB11 and/or LB1N (in p-type well 211') by applying different biases to the p-type wells 211' and 212' using signal lines PW11 and PW1K. Similarly, data may be written to memory cell transistors of bytes RBK1 and/or RBKN (in p-type well 222') without writing data to memory cell transistors RB11 and/or RB1N (in p-type well 221') by applying different biases to the p-type wells 221' and 222' using signal lines PW21 and PW2K, during a write operation for the structure of FIG. 6B. Accordingly, a write operation may be performed selectively with respect to memory cell transistors of different bytes coupled to a same local control gate line but located in different p-type wells. During an erase operation for the structure of FIG. 6A, for example, data of memory cell transistors of bytes LBK1 and/or LBKN (in p-type well 212') may be erased without erasing data of memory cell transistors LB11 and/or LB1N (in p-type well 211') by applying different biases to the p-type wells 211' and 212' using signal lines PW11 and PW1K. Similarly, data of memory cell transistors of bytes RBK1 and/or RBKN (in p-type well 222') may be erased without erasing data of memory cell transistors RB11 and/or RB1N (in p-type well 221') by applying different biases to the p-type wells 221' and 222' using signal lines PW21 and PW2K during a write operation for the structure of FIG. 6B. Accordingly, an erase operation may be performed selectively with respect to memory cell transistors of different bytes coupled to a same local control gate line but located in different p-type wells.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. An electronic system comprising:
   a semiconductor substrate including first and second electrically isolated wells having a same conductivity type;
   a first plurality of non-volatile memory cell transistors on the first well;
   a second plurality of non-volatile memory cell transistors on the second well;
   a local control gate line electrically coupled with the first and second pluralities of non-volatile memory cell transistors; and
   a single group selection transistor electrically coupled between the local control gate line and a global control gate line, wherein the single group selection transistor is commonly coupled with the first and second pluralities of non-volatile memory cell transistors through the local control gate line and configured to electrically couple and decouple the local control gate line and the global control gate line responsive to a group selection gate signal applied to a gate of the single group selection transistor,
   wherein the first well and the second well are biased with different voltages to selectively erase either the first plurality of non-volatile memory cell transistors or the second plurality of non-volatile memory cell transistors during an erase operation while applying a same control gate signal from the global control gate line through the single group selection transistor and the local control gate line to the first and second pluralities of non-volatile memory cell transistors respectively on the first and second electrically isolated wells.

2. The electronic system according to claim 1 wherein the first and second electrically isolated wells have a first conductivity type and wherein the semiconductor substrate includes a well having a second conductivity type different than the first conductivity type and wherein the single group selection transistor is on the well having the second conductivity type.

3. The electronic system according to claim 2 wherein the first and second electrically isolated wells having the same conductivity type comprise first and second electrically isolated p-type wells, wherein the well having the second conductivity type comprises an n-type well, and wherein the single group selection transistor comprises a PMOS group selection transistor.

4. The electronic system according to claim 2 wherein the well having the second conductivity type is between the first and second electrically isolated wells having the first conductivity type.

5. The electronic system according to claim 2 wherein the first well having the first conductivity type is between the well having the second conductivity type and the second well having the first conductivity type.

6. The electronic system according to claim 1 further comprising:
a controller coupled to the first and second wells having the first conductivity type, coupled to the global control gate line, and coupled to the gate of the single group selection transistor, wherein the controller is configured to apply the different voltages to the first and second electrically isolated wells having the first conductivity type at the same time, and while applying the different voltages to the first and second electrically isolated wells, to apply a turn on signal to the gate of the single group selection transistor and to apply the same control gate signal from the global control gate line through the single group selection transistor to the local control gate line and to the first and second pluralities of non-volatile memory cell transistors to thereby erase programmed states of the first plurality of memory cell transistors while maintaining programmed states of the second plurality of memory cell transistors.

7. The electronic system according to claim 6 wherein the controller is further configured to receive address information from an input/output bus during a read operation and wherein the controller is configured to provide data from at least one of the first and/or second pluralities of non-volatile memory cell transistors to the input/output bus responsive to the address information during the read operation.

8. The electronic system according to claim 7 further comprising:
a processor coupled to the input/output bus wherein the processor is configured to generate the address information and to provide the address information to the controller over the input/output bus, and wherein the processor is further configured to receive the data from the controller over the input/output bus during the read operation.

9. The electronic system according to claim 6 wherein the controller is further configured to receive address information and data from an input/output bus during a write operation and wherein the controller is configured to write the data to at least one of the first and/or second pluralities of non-volatile memory cell transistors defined by the address information.

10. The electronic system according to claim 9 further comprising:
a processor coupled to the input/output bus wherein the processor is configured to generate the address information and the data and to provide the address information and the data to the controller over the input/output bus during the write operation.

* * * * *